United States Patent [19]

Mizunoya et al.

[11] Patent Number: 4,693,409

[45] Date of Patent: Sep. 15, 1987

[54] METHOD FOR DIRECTLY BONDING CERAMIC AND METAL MEMBERS AND LAMINATED BODY OF THE SAME

[75] Inventors: Nobuyuki Mizunoya; Hajime Kohama; Yasuyuki Sugiura, all of Yokohama, Japan

[73] Assignee: Tokyo Shibarua Denki Kabushiki Kaisha, Kawasaki, Japan

[21] Appl. No.: 697,874

[22] Filed: Feb. 4, 1985

Related U.S. Application Data

[62] Division of Ser. No. 507,004, Jun. 23, 1983, abandoned.

[30] Foreign Application Priority Data

Jun. 29, 1982 [JP] Japan ................. 57-112401
Jun. 29, 1982 [JP] Japan ................. 57-112402

[51] Int. Cl.$^4$ ........................................ B23K 35/368
[52] U.S. Cl. ................................ 228/122; 228/124; 228/193; 228/263.12; 228/263.18; 228/903
[58] Field of Search .............. 228/122, 123, 124, 193, 228/198, 903, 263.12

[56] References Cited

U.S. PATENT DOCUMENTS

| | | | |
|---|---|---|---|
| 3,110,571 | 11/1963 | Alexander ........................ | 228/122 |
| 3,993,411 | 11/1976 | Babcock et al. .................. | 228/903 |
| 3,994,430 | 11/1976 | Cusano et al. ................... | 228/122 |
| 4,050,956 | 9/1977 | de Bruin et al. ................. | 288/122 |
| 4,129,243 | 12/1978 | Cusano et al. ................... | 228/122 |
| 4,273,822 | 6/1981 | Bube ................................. | 428/432 |
| 4,540,462 | 9/1985 | Mizunoya et al. ............... | 156/901 |

FOREIGN PATENT DOCUMENTS 5237914 3/1977 Japan .

OTHER PUBLICATIONS

Burgess et al., The Direct Bonding of Metals to Ceramics by the Gas-Metal Eutectic Method, J. Electrochem. Soc., (USA), vol. 122, #5, May 1975.

*Primary Examiner*—Nicholas P. Godici
*Assistant Examiner*—Samuel M. Heinrich
*Attorney, Agent, or Firm*—Cushman, Darby & Cushman

[57] ABSTRACT

A laminated body comprising a ceramic member and a metal member, and a method of forming the laminated body are described. The laminated body is characterized in that the ceramic member contains in its surface portion a bonding agent and the metal member is directly bonded to the surface of the ceramic member. The method of forming the laminated body is characterized in that a bonding agent-containing layer is first formed in the surface of the ceramic member and then the bonding agent-containing layer is heated while being contacted with the metal member.

4 Claims, No Drawings

METHOD FOR DIRECTLY BONDING CERAMIC AND METAL MEMBERS AND LAMINATED BODY OF THE SAME

This is a division of application Ser. No. 507,004 filed Jun. 23, 1983, now abandoned.

BACKGROUND OF THE INVENTION

The present invention relates to a method for directly bonding a metal member to a ceramic member, and to a laminated body of ceramic and metal members obtained by this method.

A conventional method for bonding a metal member to a ceramic member of alumina or the like is known in which a molybdenum paste is baked on the surface of the ceramic member, and nickel plating is then performed to securely bond the metal member thereto. This method is adopted when the ceramic involved is an oxide. However, when the ceramic is made of a substance other than an oxide, such as a nitride, another method is adopted. According to this method, a recessed area is formed in one of the members to be bonded, while a projection is formed on the other member in a corresponding pattern, and the two members are then shrink fitted to each other. The former method is complex in procedure and requires two heat treatment steps. On the other hand, the latter method can provide only a weak adhesive strength since the two members are bonded only by a clamping force.

To solve this problem, still another method has been proposed in which a metal member is directly bonded to a ceramic member. This method includes a first method in which a metal member is brought into direct contact with a ceramic member and the two members are heated in a gas atmosphere containing a bonding agent; and, a second method in which a metal member is surface-treated with a bonding agent, the treated metal member is brought into contact with a ceramic member and the two members are heated in an inert gas atmosphere (e.g., U.S. Pat. No. 3,994,430).

However, these methods have a common disadvantage in that, when the ceramic member consists of a ceramic which does not contain a bonding agent at all or contains such agent only in a small amount, bonding of such a ceramic member to a metal member is very difficult.

This means that if a ceramic member consists of a nonoxide-type ceramic, such as silicon nitride, and the bonding agent is oxygen, bonding of the ceramic member to a metal member will be difficult. The reasons for this are considered to be attributable to the facts that a eutectic of a metal and a bonding agent which is produced at the interface between the ceramic member and the metal member has poor wettability with a ceramic member consisting of a nonoxide-type ceramic, and that oxygen contained in a ceramic member contributes in some manner to producing a stable compound with a metal.

SUMMARY OF THE INVENTION

The present invention has been made in view of this situation and has for its object to provide a method for directly bonding a ceramic member to a metal member even if the ceramic member consists of a ceramic which does not contain a bonding agent, such as a nonoxide-type ceramic.

It is another object of the present invention to provide a laminated body in which a ceramic member and a metal member are directly bonded to each other, such as a circuit board with excellent heat conductivity, or an envelope for an electron tube or a rectifying element.

In accordance with an aspect of the present invention, a method is provided for directly bonding a ceramic member and a metal member, comprising the steps of forming, in at least a surface layer of the ceramic member, a layer containing a bonding agent in an amount sufficient to bond the ceramic member to the metal member, and heating this layer while it is in contact with the metal member.

In accordance with another aspect of the present invention, a laminated body which consists of a ceramic member and a metal member is also provided, comprising a ceramic member having, in a surface layer thereof, a layer containing a bonding agent in an amount sufficient to bond the ceramic member to the metal member, and a metal member which is directly bonded to the layer.

DETAILED DESCRIPTION OF THE PREFERRED EMBODIMENTS

The present invention is based upon a finding that, if the surface of a ceramic member is surface-treated with a bonding agent or is bonded after a bonding agent is added thereto, the ceramic and metal members may be securely bonded to each other in such a way that they will not separate over a long period of time.

The ceramic member to be used herein may consist of a nonoxide-type ceramic such as a nitride, e.g., silicon nitride, aluminum nitride, or titanium nitride; a carbide, e.g., silicon carbide or titanium carbide; a boride, e.g., lanthanum boride; or, an oxide-type ceramic such as silica, alumina and zirconia.

A ceramic selected may contain, as a sintering auxiliary, an oxide of yttrium, aluminum, calcium, strontium or beryllium; a carbonate; or other salts.

The method of the present invention is particularly effective in bonding a nonoxide-type ceramic member to a metal member.

A bonding agent to be used herein produces a eutectic in combination with a metal and may include oxygen, sulfur, phosphorus, silicon or the like. The bonding agent may be selected in accordance with the types and combinations of the ceramic and metal members. For example, when the metal member comprises copper, iron, chromium or the like, the most desirable bonding agent is oxygen or sulfur. If the metal member comprises aluminum, silicon is suitable for use as a bonding agent.

The amount of bonding agent needed to achieve satisfactory bonding is somewhere between the maximum amount at which the bonding agent is in the form of a solid solution and the eutectic-forming amount.

Addition of a bonding agent to the surface layer of the ceramic member may be performed by a conventional method. For example, when a ceramic member consists of a nitride and the bonding agent is oxygen, the ceramic member is heated to 1,000° to 1,400° C. in air or is heated to 1,250° to 1,500° C. in a wet-forming gas ($H_2 + N_2$), to achieve oxidation. When the heating temperature is lower than the above-mentioned ranges, a required bonding agent layer is not formed. On the other hand, when the heating temperature is higher than these ranges, the formed bonding layer becomes separated from the ceramic member. Heating in air allows formation of a bonding agent layer (oxide layer) at a low temperature, while heating in a wet-forming gas allows formation of a dense bonding agent layer (oxide layer). The bonding agent layer formed in this manner preferably has a thickness of about 20μ, and more preferably 10μ or less. The effect of formation of a bonding agent layer may be obtained with a layer thickness of about 0.001μ or more.

When the bonding agent is contained throughout the ceramic member, the bonding agent may be contained in the form of a compound. For example, when the bonding agent is oxygen, it may be contained in a nonoxide-type ceramic member in the form of an oxide.

The oxide may be yttrium oxide, titanium oxide, alumina, silica, magnesium oxide, or a glass. The oxide as the bonding agent may be added in an amount of 5 to 50% by weight, and preferably 10 to 30% by weight. When the amount of the oxide is less than the lower limit, bonding strength becomes unsatisfactory. On the other hand, when the amount of the oxide exceeds the upper limit, the original characteristics of the ceramic are impaired. Particularly preferable results may be obtained if the oxide is used in the amount of 10 to 30% by weight.

When sulfur is used as the bonding agent, it may be contained in the form of a sulfide. When phosphorus is used as the bonding agent, it may be contained in the form of a glass containing phosphorus. When silicon is used as the bonding agent, the metal is molybdenum and the ceramic is alumina or aluminum nitride, which may be contained in the form of $MoSi_2$. However, when silicon is used as the bonding agent, the metal is aluminum and the ceramic is alumina or aluminum nitride, which may be contained in the form of $AlSi_2$.

The metal member to be used in the present invention may consist of a simple body of copper, iron, chromium, nickel, molybdenum, silver, cobalt, or aluminum; or, alloys or mixtures thereof. The shape of the metal member may be columnar, plate-like, foil-like, or granular.

The metal member preferably contains a bonding agent at least in a surface layer thereof. For example, when the metal member consists of copper, a metal containing a bonding agent (preferably oxygen) in the amount of 80 to 3,900 ppm is preferably used. This is to allow easy bonding. When the metal is copper and the bonding agent is oxygen, an electrolytic tough pitch copper is preferably used. Bonding may also be facilitated if the metal is surface-treated with a bonding agent to form a surface layer of 0.01 μm to 1 μm containing the bonding agent.

To bond metal and ceramic members together, the metal member is brought into direct contact with the surface of a ceramic member which contains a bonding agent or with the surface of a ceramic member which has been surface-treated (by a bonding agent impregnation treatment process). The heating temperature is preferably below the melting point of the metal and above the eutectic temperature of the eutectic. For example, when the metal member consists of copper and the bonding agent is oxygen, the heating temperature is below the melting temperature of copper (1,083° C.) and above the eutectic temperature of copper-copper oxide (1,065° C.). When a metal member contains a bonding agent or is surface-treated therewith, heating is performed in a gas atmosphere which is inert to the ceramic member, such as a nitrogen atmosphere. When a metal member does not contain a bonding agent, heating is performed in a reactive atmosphere containing 0.03 to 0.1 vol % of a bonding agent, to facilitate easy bonding. It is preferable for minimizing the deformation of a bonded structure to bond metal members on opposite surfaces of a ceramic member.

EXAMPLE 1

A plate-shaped ceramic member was used which consisted of a silicon nitride containing 4% by weight of yttrium oxide and 4% by weight of alumina as a sintering auxiliary, and which had dimensions of 30×30×2 mm. The ceramic member was heated at 1,250° C. in air for 1 hour and the ceramic surface was slightly oxidized. A plate-shaped metal member consisting of electrolytic tough pitch copper and having dimensions of 10×50×0.3 mm (300 to 500 ppm oxygen content) was brought into contact with the oxidized surface of the ceramic member. These members were then heated at 1,075° C. in this state in a nitrogen atmosphere. After the members were cooled to substantially room temperature, their bonding state was examined, and proved to be excellent. The peel strength of the members was measured by a peel test and was determined to be 5~10 kg/cm.

COMPARATIVE EXAMPLE 1

The procedures of Example 1 were followed, except that the ceramic member was not heated in air but was brought directly into contact with a metal member of an electrolytic tough pitch copper. The resultant laminated body had a peel strength of 1~3 kg/cm.

EXAMPLE 2

A plate-shaped ceramic member was used which consisted of an aluminum nitride containing 2% by weight of yttrium oxide and 2% by weight of alumina as a sintering auxiliary, and which had dimensions of 30×30×2 mm. The ceramic member was heated in air at 1,200° C. for 1 hour and the ceramic surface was slightly oxidized. A plate-shaped metal member consisting of electrolytic tough pitch copper and having dimensions of 10×50×0.3 mm was brought into contact with the oxidized surface of the ceramic member. The two members were then heated at 1,075° C. in this state in a nitrogen atmosphere. After the members were cooled to substantially room temperature, their bonding state was examined, and proved to be excellent. The peel strength of the members was measured to be 8~12 kg/cm.

EXAMPLE 3

A plate-shaped ceramic member was used which consisted of a silicon carbide containing 4% by weight of yttrium oxide and 4% by weight of alumina as a sintering auxiliary, and had dimensions of 30×30×2 mm. The ceramic member was heated in air at 1,150° C. for 1 hour and the ceramic surface was slightly oxidized. A plate-shaped metal member consisting of an electrolytic tough pitch copper and having dimensions of 10×50×0.3 mm was brought into contact with the oxidized surface of the ceramic member. These members were then heated at 1,075° C. in this state in a nitrogen atmosphere. After the members were cooled to a substantially ambient temperature, their bonding state was examined, and proved to be excellent. The peel strength of the members was measured to be 5~10 kg/cm.

EXAMPLE 4

A plate-shaped ceramic member was used which consisted of a silicon nitride containing 5% by weight of yttrium oxide, 5% by weight of alumina and 5% by weight of silica, and which had dimensions of 30×30×2 mm. A plate-shaped ceramic member of an electrolytic tough pitch copper and having dimensions of 10×50×0.3 mm was brought into contact with the ceramic member. These members were then heated in this state in a nitrogen atmosphere at 1,075° C. for 10 minutes. After the members were cooled to a substantially room temperature, they were examined for bonding strength. The peal strength of the resultant laminated body was measured to be 5~10 kg/cm.

COMPARATIVE EXAMPLE 2

A plate-shaped ceramic body was used which consisted of a silicon nitride, containing 3% by weight of magnesium oxide, and had dimensions of 30×30×2 mm. A metal member consisting of an electrolytic tough pitch copper and having dimensions of 10×50×0.3 mm was brought into contact with the ceramic member. These members were heated in a manner similar to that in Example 3. The laminated body obtained had poor bonding strength and its peel strength was measured to be 1~3 kg/cm.

EXAMPLE 5

A plate-shaped ceramic member was used which consisted of aluminum nitride containing 5% by weight of yttrium oxide, 5% by weight of alumina and 5% by weight of silica, and which had dimensions of 30×30×2 mm. A metal member consisting of electrolytic tough pitch copper and having dimensions of 10×50×0.3 mm was brought into contact with the ceramic member. These members were heated in a nitrogen gas atmosphere at 1,075° C. for 10 minutes. After the members were cooled to substantially room temperature, they exhibited excellent bonding strength. The resultant laminated body had a peel strength of 8~12 kg/cm.

EXAMPLE 6

A plate-shaped ceramic member was used which consisted of a silicon nitride containing 5% by weight of yttrium oxide, 5% by weight of alumina and 5% by weight of silica, and had dimensions of 30×30×2 mm. A metal member consisting of an electrolytic tough pitch copper and having dimensions of 10×50×0.3 mm was brought into contact with the ceramic member. These members were heated in this state in a nitrogen gas atmosphere at 1,075° C. for 10 minutes. After the members were cooled to a substantially room temperature, they exhibited excellent bonding strength. The resultant laminated body had a peel strength of 5~10 kg/cm.

In summary, according to the method of the present invention, even a ceramic member which does not contain a bonding agent may be directly bonded to a metal member with ease. The method of the present invention is useful in heat-conductive assemblies such as semiconductor mount substrates, envelopes for electron tubes or rectifying elements, etc. In particular, combinations of aluminum nitride/copper, and silicon carbide/copper are preferable as heat-conductive assemblies.

What is claimed is:

1. A method for directly bonding a nonoxide-type ceramic member selected from the group consisting of nitride ceramic member and carbide member to a copper member, comprising the steps of:
   oxidizing a surface of said ceramic member to form an oxide layer 20 μm or less in thickness,
   bringing said copper member into contact with the oxide layer of said nonoxide-type ceramic member, and
   heating said copper member and said nonoxide-type ceramic member at a temperature of from 1065° to 1083° C. in an inert gas atmosphere to directly bond said copper member to said nonoxide-type ceramic member.

2. A method according to claim 1, wherein the oxidizing step is performed in an air atmosphere at a temperature of 1,000° to 1,400° C.

3. A method according to claim 1, wherein the oxidizing step is performed in a wet gas atmosphere at a temperature of 1,200° to 1,500° C.

4. A method according to claim 1, wherein the heating temperature is below the melting temperature of the metal of said metal member and above the eutectic temperature of said metal and said bonding agent.

* * * * *